United States Patent
Chong et al.

(10) Patent No.: US 10,122,339 B2
(45) Date of Patent: Nov. 6, 2018

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Won Sik Chong, Suwon-Si (KR); Jae Young Park, Suwon-Si (KR); Jong Young Kim, Suwon-Si (KR); Woo Jin Choi, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 149 days.

(21) Appl. No.: 14/878,805

(22) Filed: Oct. 8, 2015

(65) Prior Publication Data
US 2016/0142032 A1    May 19, 2016

(30) Foreign Application Priority Data

Nov. 14, 2014    (KR) .................. 10-2014-0158504

(51) Int. Cl.
| | | |
|---|---|---|
| H03H 7/01 | (2006.01) | |
| H01G 4/12 | (2006.01) | |
| H01G 4/30 | (2006.01) | |
| H01G 4/012 | (2006.01) | |
| H03H 1/00 | (2006.01) | |
| H03H 7/42 | (2006.01) | |

(52) U.S. Cl.
CPC .......... *H03H 7/0115* (2013.01); *H01G 4/012* (2013.01); *H01G 4/12* (2013.01); *H01G 4/30* (2013.01); *H03H 1/0007* (2013.01); *H03H 7/427* (2013.01)

(58) Field of Classification Search
CPC ............................................ H03H 2001/0085
USPC ............ 333/185; 174/260; 361/275.1, 301.4, 361/305, 321.1, 303, 311; 29/25.03
See application file for complete search history.

(56) References Cited

U.S. PATENT DOCUMENTS

| | | | |
|---|---|---|---|
| 2003/0030510 A1 | 2/2003 | Sasaki et al. | |
| 2014/0313785 A1* | 10/2014 | Lee | H02M 3/33507 363/21.01 |
| 2015/0116891 A1* | 4/2015 | Park | H01G 4/40 361/270 |

FOREIGN PATENT DOCUMENTS

| | | |
|---|---|---|
| JP | 11-097291 A | 4/1999 |
| JP | 2011-004324 A | 1/2011 |
| JP | 2011004324 A * | 1/2011 |
| KR | 2003-0014586 A | 2/2003 |

\* cited by examiner

*Primary Examiner* — Benny Lee
*Assistant Examiner* — Hafizur Rahman
(74) *Attorney, Agent, or Firm* — McDermott Will & Emery LLP

(57) ABSTRACT

A composite electronic component includes a composite body in which a common mode filter and a multilayer ceramic capacitor array are coupled to each other, the common mode filter including a first body in which a common mode choke coil is disposed, and the multilayer ceramic capacitor array including a second body in which a plurality of dielectric layers are stacked.

10 Claims, 9 Drawing Sheets

COMPOSITE ELECTRONIC COMPONENT AND BOARD HAVING THE SAME

CROSS-REFERENCE TO RELATED APPLICATION

This application claims the benefit of priority to Korean Patent Application No. 10-2014-0158504, filed on Nov. 14, 2014 with the Korean Intellectual Property Office, the entirety of which is incorporated herein by reference.

BACKGROUND

The present disclosure relates to a composite electronic component including a plurality of passive elements and a board having the same.

In accordance with recent demand for thinness and lightness of electronic devices, as well as improved performance, electronic devices are required to have significantly reduced size and increased functionality.

For example, regarding modern electronic devices, a liquid crystal display (LCD) connector may employ a differential transmission scheme for a high-speed signal, and use a common mode filter (CMF) for removing common mode noise.

In addition, a multilayer ceramic capacitor for DC blocking has been used in series with the common mode filter (CMF) as a filter for differential transmission.

However, since electronic devices perform various functions, the number of common mode filters (CMF) and multilayer ceramic capacitors has increased, and the number of other passive elements has also increased.

For this reason, the component disposition area of electronic devices must be increased, which may limit miniaturization of electronic devices.

Therefore, research into technology for decreasing the component disposition area of electronic devices and manufacturing costs is ongoing.

SUMMARY

One aspect of the present disclosure may provide a composite electronic component in which a component mounting area may be decreased in a liquid crystal display (LCD) connector to which a differential transmission scheme of a high-speed signal is applied, and a board having the same.

One aspect of the present disclosure may also provide a composite electronic component for removing common mode noise in a LCD connector to which a differential transmission scheme of a high-speed signal is applied, and a board having the same.

According to one aspect of the present disclosure, a composite electronic component may comprise a composite body in which a common mode filter and a multilayer ceramic capacitor array are coupled to each other, the common mode filter including a common mode choke coil, and the multilayer ceramic capacitor array including a plurality of dielectric layers; first to fourth external electrodes disposed on both side surfaces of the common mode filter and electrically connected to the common mode choke coil, and first and second connecting electrodes disposed on both side surfaces of the common mode filter and insulated from the first to fourth external electrodes; and fifth to eighth external electrodes disposed on both side surfaces of the multilayer ceramic capacitor array, and third and fourth connecting electrodes disposed on both side surfaces of the multilayer ceramic capacitor array and insulated from the fifth to eighth external electrodes, wherein the composite body includes first IC connection terminals and second IC connection terminals formed by coupling the first connecting electrode and the seventh external electrode and coupling the second connecting electrode and the eighth external electrode, respectively, first input terminals and second input terminals formed by coupling the fifth and first external electrodes and coupling the sixth and second external electrodes, respectively, and first output terminals and second output terminals formed by coupling the third external electrode and the third connecting electrode and coupling the fourth external electrode and the fourth connecting electrode, respectively.

In the multilayer ceramic capacitor array, a plurality of dummy dielectric layers may be disposed between dielectric layers on which internal electrodes are disposed.

The dielectric layers and the dummy dielectric layers may have different compositions.

The multilayer ceramic capacitor array may include first to fourth internal electrodes stacked therein and having leads exposed externally.

The fifth to eighth external electrodes may be connected to the first to fourth internal electrodes, respectively.

The first to fourth internal electrodes may be perpendicular to a mounting surface of the composite body.

The first to fourth internal electrodes may be disposed in parallel with a mounting surface of the composite body.

A lower surface of the multilayer ceramic capacitor array may be coupled to an upper surface of the common mode filter.

The common mode filter and the multilayer ceramic capacitor array may be coupled to each other by a conductive adhesive.

According to one aspect of the present disclosure, a composite electronic component may comprise a composite body in which a common mode filter and a multilayer ceramic capacitor array are coupled to each other, the common mode filter including a common mode choke coil, and the multilayer ceramic capacitor array including a plurality of dielectric layers; wherein the multilayer ceramic capacitor array includes a plurality of internal electrodes disposed on the dielectric layers and a plurality of dummy dielectric layers, wherein the dummy dielectric layers are disposed between dielectric layers having internal electrodes.

The dummy dielectric layers may have a different composition than the dielectric layers.

BRIEF DESCRIPTION OF DRAWINGS

The above and other aspects, features and advantages of the present disclosure will be more clearly understood from the following detailed description taken in conjunction with the accompanying drawings.

DETAILED DESCRIPTION

Figure 1:
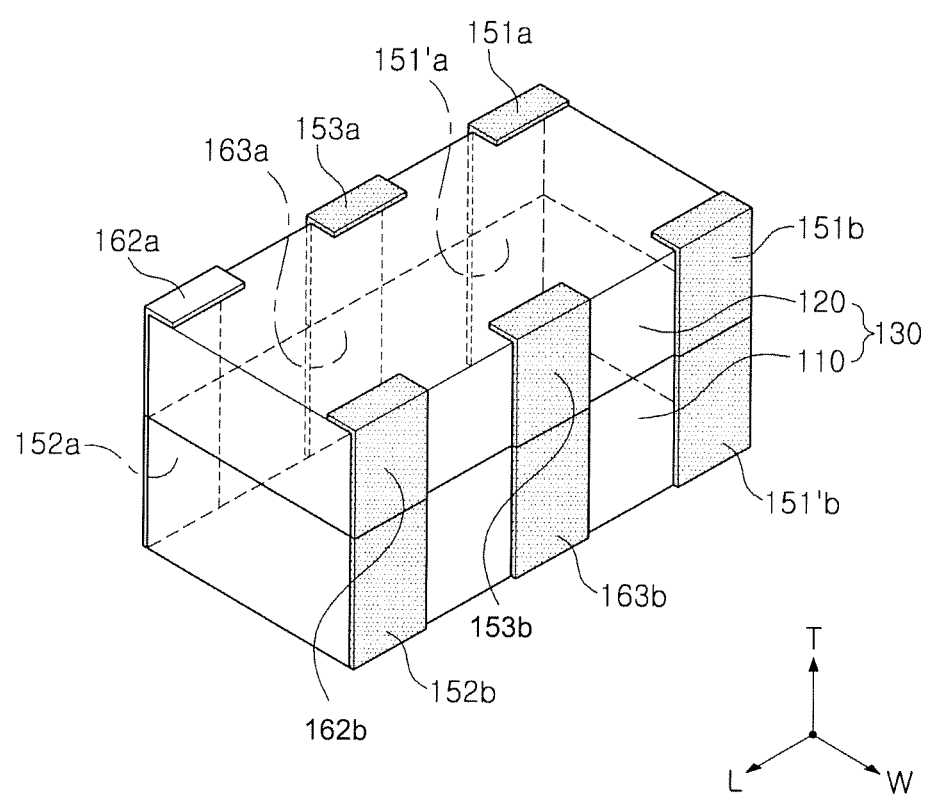
FIG. 1 is a perspective diagram schematically illustrating a composite electronic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Composite Electronic Component

FIG. 1 is a perspective diagram schematically illustrating a composite electronic component according to an exemplary embodiment in the present disclosure.

Figure 2:
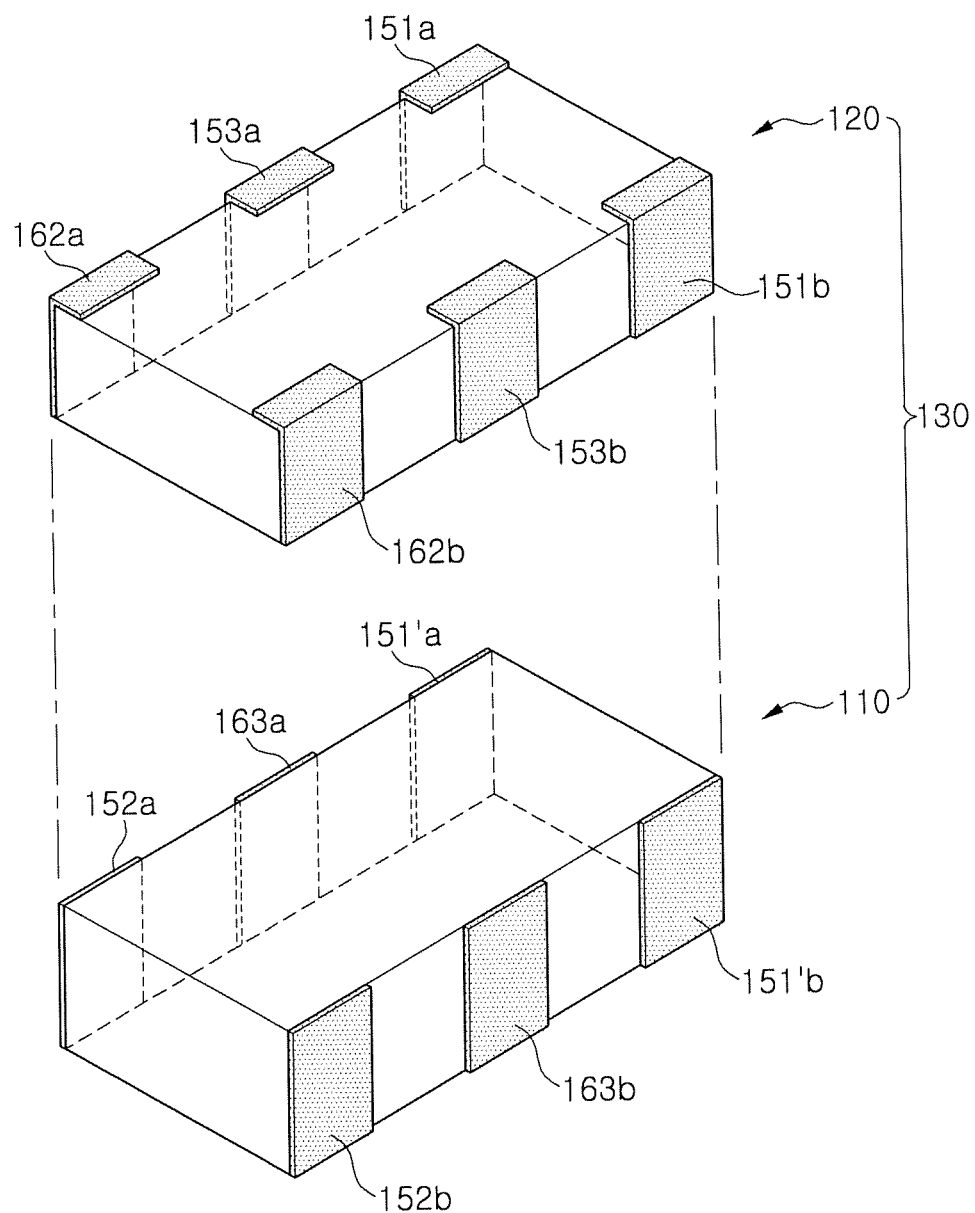
FIG. 2 is a schematic perspective diagram illustrating a form in which each of the components is coupled to one another in the composite electronic component of FIG. 1.

FIG. 2 is a schematic perspective diagram illustrating a form in which each of the components is coupled to one another in the composite electronic component of FIG. 1.

Referring to FIG. 1, in the composite electronic component, according to the exemplary embodiment, a 'length direction' refers to an 'L' direction of FIG. 1, a 'width direction' refers to a 'W' direction of FIG. 1, and a 'thickness direction' refers to a 'T' direction of FIG. 1.

Meanwhile, the length, width, and thickness directions of the composite electronic component may be the same as length, width, and thickness directions of a common mode filter and a multilayer ceramic capacitor array, respectively, as described below.

In addition, in an exemplary embodiment in the present disclosure, the composite electronic component may have upper and lower surfaces opposing each other, first and second side surfaces and first and second end surfaces that connect the upper and lower surfaces to each other. A shape of the composite electronic component is not particularly limited, but may be hexahedral, as shown.

Further, the first and second end surfaces of the composite electronic component in the length direction and the first and second side surfaces thereof in the width direction may be defined as surfaces in the same directions as directions of first and second end surfaces of the common mode filter and the multilayer ceramic capacitor array in the length direction and first and second side surfaces of the common mode filter and the multilayer ceramic capacitor array in the width direction, respectively, as described below.

However, as illustrated in FIG. 1, an upper or lower surface of the common mode filter and an upper or lower surface of the multilayer ceramic capacitor array may be coupling surfaces coupled to each other.

Meanwhile, in the composite electronic component, the common mode filter and the multilayer ceramic capacitor array may be coupled to each other, and when the multilayer ceramic capacitor array is coupled on the common mode filter, the upper surface of the composite electronic component may be defined as the upper surface of the multilayer ceramic capacitor array, and the lower surface of the composite electronic component may be defined as the lower surface of the common mode filter.

Further, the first and second side surfaces may correspond to surfaces of the composite electronic component opposing each other in the width direction, the first and second end surfaces may correspond to surfaces of the composite electronic component opposing each other in the length direction, and the upper and lower surfaces may correspond to surfaces of the composite electronic component opposing each other in the thickness direction.

Referring to FIGS. 1 and 2, a composite electronic component 100 may include a composite body 130 in which a common mode filter 110 and a multilayer ceramic capacitor array 120 are coupled to each other, wherein the common mode filter 110 includes a first body in which a common mode choke coil is disposed, and the multilayer ceramic capacitor array 120 includes a second body in which a plurality of dielectric layers are stacked.

A shape of the composite body 130 is not particularly limited, but may be hexahedral, as shown.

The hexahedral composite body 130 may be formed by coupling the common mode filter 110 and the multilayer ceramic capacitor array 120 to each other, and a method of forming the composite body 130 is not particularly limited.

For example, the composite body 130 may be formed by coupling the separately manufactured common mode filter 110 and multilayer ceramic capacitor array 120 to each other using a conductive adhesive, a resin, or the like, but the method of forming the composite body 130 is not particularly limited thereto.

The adhesive or resin used to couple the common mode filter 110 and the multilayer ceramic capacitor array 120 to each other may contain, for example, an epoxy resin, but is not limited thereto.

A method of coupling the common mode filter 110 and the multilayer ceramic capacitor array 120 to each other using the conductive adhesive, the resin, or the like, is not particularly limited. For example, the common mode filter 110 and the multilayer ceramic capacitor array 120 may be coupled to each other by applying, heating, and curing the conductive adhesive, the resin, or the like, onto the coupling surface of the common mode filter 110 or the multilayer ceramic capacitor array 120.

Meanwhile, according to one exemplary embodiment, the multilayer ceramic capacitor array 120 may be disposed on the common mode filter 110.

Therefore, the transferring of vibrations of the capacitor due to an inverse piezoelectric property of the multilayer ceramic capacitor array 120 to a board may be decreased, such that acoustic noise may be decreased.

Further, according to another exemplary embodiment in the present disclosure, the multilayer ceramic capacitor array 120 may be disposed beneath the common mode filter 110. However, a disposition form of the multilayer ceramic capacitor array 120 is not particularly limited.

Hereinafter, the common mode filter 110 and the multilayer ceramic capacitor array 120 configuring the composite body 130 will be described in detail.

According to an exemplary embodiment, the first body configuring the common mode filter 110 may contain the common mode choke coil (not illustrated).

The common mode filter 110 is not particularly limited. For example, any filter may be used as long as it is a filter for removing common mode noise in an application to which a differential transmission scheme of a high-speed signal is applied.

The common mode filter 110 may have a structure in which the first body includes the common mode choke coil (not illustrated) therein and is filled with a magnetic material or ceramic, and terminal electrodes are disposed on outer peripheral surfaces thereof.

For the magnetic material, a Ni—Cu—Zn based ferrite material, a Ni—Cu—Zn—Mg based ferrite material, or a Mn—Zn based ferrite material may be used. However, the magnetic material is not limited thereto.

The common mode choke coil may have four exposed portions exposed to both side surfaces of the first body of the common mode filter 110 in the width direction.

The four exposed portions may be connected to first and second input terminals 151'a and 151'b and first and second output terminals 152a and 152b, respectively, as described below.

Meanwhile, the second body configuring the multilayer ceramic capacitor array 120 may be formed by stacking the plurality of dielectric layers, and a plurality of internal electrodes may be disposed to be separated from each other in the second body with at least one of the dielectric layers interposed therebetween.

The plurality of dielectric layers configuring the second body may be sintered together, and adjacent dielectric layers may be integrated with each other so that boundaries therebetween are not readily apparent.

The dielectric layers may be formed by sintering ceramic green sheets containing ceramic powder, an organic solvent, and an organic binder. The ceramic powder, which is a material having high permittivity, may be a barium titanate ($BaTiO_3$) based material, a strontium titanate ($SrTiO_3$) based material, or the like, but is not limited thereto.

A detailed description of an internal structure of the multilayer ceramic capacitor array 120 will be provided below.

The composite electronic component 100, according to the exemplary embodiment, may include first to fourth external electrodes 151'a, 151'b, 152a, and 152b disposed on both side surfaces of the first body and electrically connected to the common mode choke coil, first and second connecting electrodes 163a and 163b disposed on both side surfaces of the first body and insulated from the first to fourth external electrodes 151'a, 151' b, 152a, and 152b, fifth to eighth external electrodes 151a, 151b, 153a, and 153b disposed on both side surfaces of the second body, and third and fourth connecting electrodes 162a and 162b disposed on both side surfaces of the second body and insulated from the fifth to eighth external electrodes 151a, 151b, 153a, and 153b.

The first to fourth external electrodes 151'a, 151'b, 152a, and 152b may be formed on both side surfaces of the first body in the width direction and extended to the upper and lower surfaces of the first body.

The first to fourth external electrodes 151'a, 151'b, 152a, and 152b may be disposed to be insulated from each other, the first and second external electrodes 151'a and 151'b may be disposed to face each other, and the third and fourth external electrodes 152a and 152b may be disposed to face each other.

The first and second connecting electrodes 163a and 163b may be disposed on both side surfaces of the first body in the width direction, respectively, insulated from the first to fourth external electrodes 151'a, 151'b, 152a, and 152b, and extended to the upper and lower surfaces of the first body.

In detail, the common mode filter 110 included in the composite electronic component, according to the exemplary embodiment, may include the first to fourth external electrodes 151'a, 151'b, 152a, and 152b and the first and second connecting electrodes 163a and 163b, such that the common mode filter 110 may be a six-terminal filter.

Further, the multilayer ceramic capacitor array 120 may include the fifth to eighth external electrodes 151a, 151b, 153a, and 153b disposed on both side surfaces of the second body and the third and fourth connecting electrodes 162a and 162b disposed on both side surfaces of the second body and insulated from the fifth to eighth external electrodes 151a, 151b, 153a, and 153b.

The fifth to eighth external electrodes 151a, 151b, 153a, and 153b may be formed on both side surfaces of the second body in the width direction, respectively, and extended to the upper and lower surfaces of the second body.

Further, the third and fourth connecting electrodes 162a and 162b may be formed on both side surfaces of the second body in the width direction and extended to the upper and lower surfaces of the second body.

The composite body 130 may include first IC connection terminals 153a and 163a and second IC connection terminals 153b and 163b formed by the coupling of the first connecting electrode 163a and the seventh external electrode 153a and the coupling of the second connecting electrode 163b and the eighth external electrode 153b, respectively, first input terminals 151a and 151'a and second input terminals 151b and 151'b formed by the coupling of the fifth and first external electrodes 151a and 151'a, and the coupling of the sixth and second external electrodes 151b and 151'b, respectively, and first output terminals 152a and 162a and second output terminals 152b and 162b formed by the coupling of the third external electrode 152a and the third connecting electrode 162a and the coupling of the fourth external electrode 152b and the fourth connecting electrode 162b, respectively.

The first IC connection terminals 153a and 163a and the second IC connection terminals 153b and 163b may substantially serve as the seventh and eighth external electrodes 153a and 153b of the multilayer ceramic capacitor array 120, and the first and second connecting electrodes 163a and 163b disposed on the common mode filter 110 may serve only as terminals connected to the seventh and eighth external electrodes 153a and 153b.

In detail, a high-speed signal transmitted from an integrated circuit (IC) may be transmitted to the seventh and eighth external electrodes 153a and 153b of the multilayer ceramic capacitor array 120 through the first and second connecting electrodes 163a and 163b disposed on the common mode filter 110 and then transmitted into the multilayer ceramic capacitor array.

Further, in the first input terminals 151a and 151'a, a signal applied into the multilayer ceramic capacitor array 120 may be applied into the common mode filter 110 through the fifth and first external electrodes 151a and 151'a.

Similarly, in the second input terminals 151b and 151'b, the signal applied into the multilayer ceramic capacitor array 120 may be applied into the common mode filter 110 through the sixth and second external electrodes 151b and 151'b.

Meanwhile, the first output terminals 152a and 162a and the second output terminals 152b and 162b may substantially serve as the third and fourth external electrodes 152a and 152b of the common mode filter 110, and the third and fourth connecting electrodes 162a and 162b disposed on the multilayer ceramic capacitor array 120 may serve only as terminals connected to the third and fourth external electrodes 152a and 152b.

The first to fourth external electrodes and the first and second connecting electrodes disposed on the common mode filter 110 and the fifth to eighth external electrodes and the third and fourth connecting electrodes disposed on the multilayer ceramic capacitor array 120, which form the IC connection terminals, the input terminals, and the output terminals, may be coupled to each other by a conductive adhesive, respectively, but a coupling method thereof is not necessarily limited thereto.

In a LCD connector to which the differential transmission scheme of the high-speed signal is applied, the first input terminals 151a and 151'a and the first output terminals 152a and 162a of the composite electronic component, according to an exemplary embodiment, may be connected to the common mode choke coil of the common mode filter 110 to thereby serve as one coil part in the composite electronic component.

Meanwhile, the second input terminals 151b and 151'b and the second output terminals 152b and 162b may be connected to the common mode choke coil of the common mode filter 110 to thereby serve as the other coil part in the composite electronic component.

The first IC connection terminals 153a and 163a, the second IC connection terminals 153b and 163b, the first input terminals 151a and 151'a, the second input terminals 151b and 151'b, the first output terminals 152a and 162a, and the second output terminals 152b and 162b may be formed of a conductive paste containing a conductive metal.

The conductive metal may be nickel (Ni), copper (Cu), tin (Sn), or an alloy thereof, but is not limited thereto.

The conductive paste may further contain an insulating material. The insulating material may be, for example, glass, but is not limited thereto.

A method of forming the IC connection terminals, the input terminals, and the output terminals is not particularly limited. In detail, the IC connection terminals, the input terminals, and the output terminals may be formed by a dipping process of the composite body or may be formed by another method such as a plating method, or the like.

Referring to FIGS. 1 and 2, in the composite electronic component, the multilayer ceramic capacitor array 120 and the common mode filter 110 are coupled to each other unlike that of the related art, such that the multilayer ceramic capacitor array 120 and the common mode filter 110 may be designed to have as short a distance as possible therebetween, thereby decreasing noise.

Further, since the multilayer ceramic capacitor array 120 and the common mode filter 110 are coupled to each other, a mounting area in the LCD connector to which the differential transmission scheme of the high-speed signal is applied may be significantly decreased, such that securing mounting space may be facilitated.

Further, manufacturing costs, such as mounting costs, or the like, may be decreased.

Further, in the composite electronic component, the multilayer ceramic capacitor array 120 is formed on the common mode filter 110, such that at the time of mounting the composite electronic component on the board, the transferring of vibrations of the capacitor due to the inverse piezoelectric property of the capacitor to the board may be decreased, thereby decreasing acoustic noise.

Figure 3:
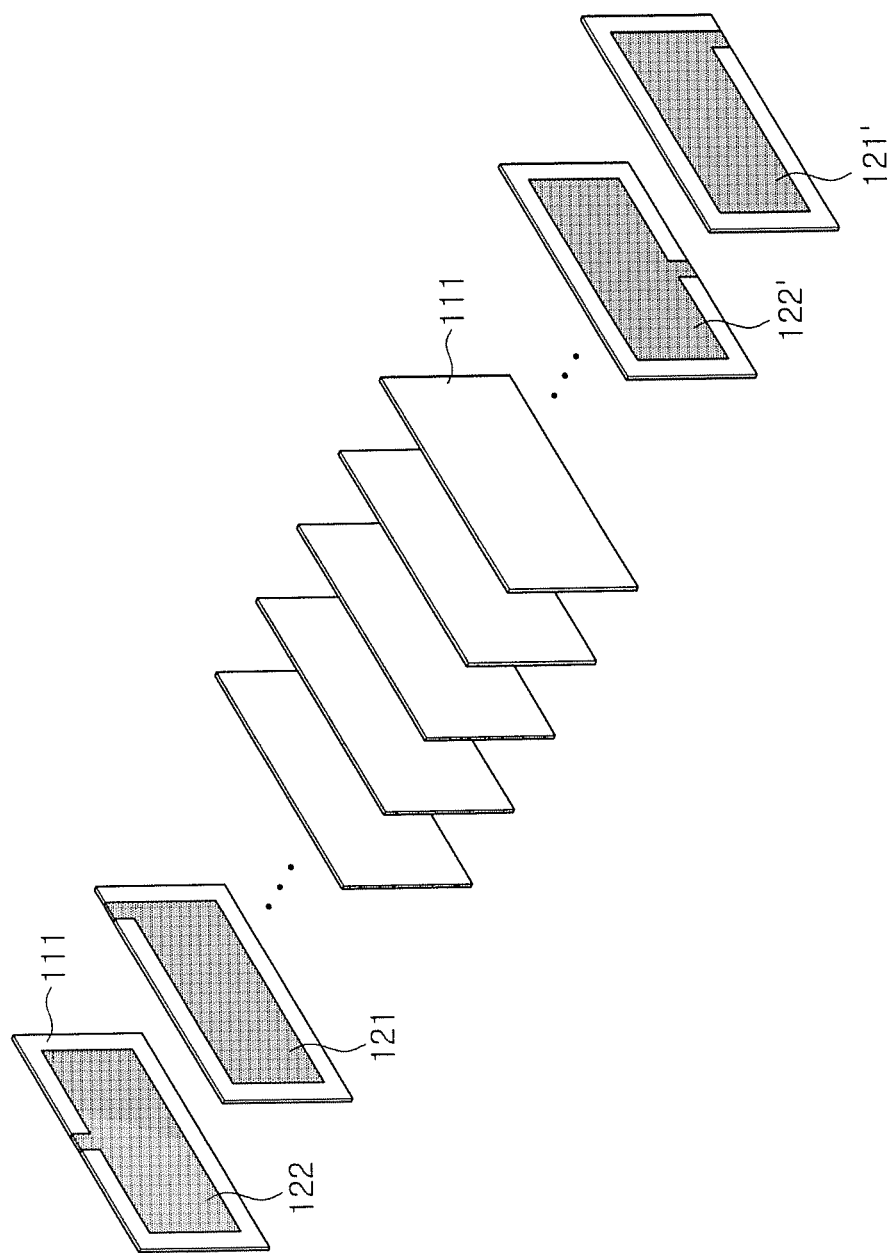
FIG. 3 is an exploded perspective diagram illustrating a form in which internal electrodes and dielectric layers of a multilayer ceramic capacitor array of FIG. 1 are stacked according to an exemplary embodiment in the present disclosure.

FIG. 3 is an exploded perspective diagram illustrating a form in which internal electrodes and dielectric layers of a multilayer ceramic capacitor array of FIG. 1 are stacked according to an exemplary embodiment in the present disclosure.

Figure 4:
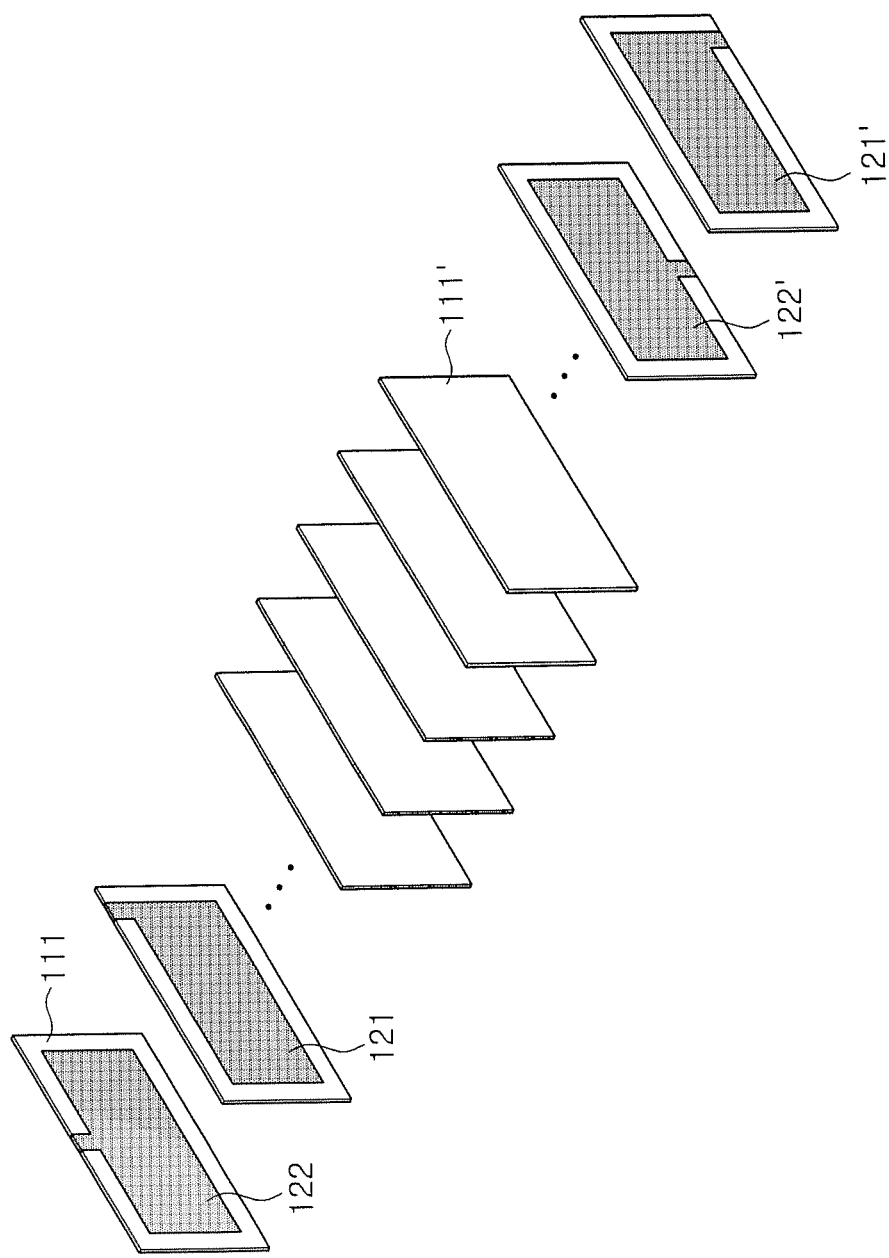
FIG. 4 is an exploded perspective diagram illustrating a form in which internal electrodes and dielectric layers of a multilayer ceramic capacitor array of FIG. 1 are stacked according to another exemplary embodiment in the present disclosure.

FIG. 4 is an exploded perspective diagram illustrating a form in which internal electrodes and dielectric layers of a multilayer ceramic capacitor array of FIG. 1 are stacked according to another exemplary embodiment in the present disclosure.

Referring to FIG. 3, in a composite electronic component, a plurality of dielectric layers 111 and first to fourth internal electrodes 121, 122, 121' and 122' may be disposed in a multilayer ceramic capacitor array 120.

In the multilayer ceramic capacitor array 120, a plurality of dummy dielectric layers ill may be inserted between the dielectric layers 111 on which the first to fourth internal electrodes 121, 122, 121', and 122' are disposed.

The plurality of dummy dielectric layers 111 may be inserted between the dielectric layers 111 on which the first to fourth internal electrodes 121, 122, 121', and 122' are disposed as described above, such that crosstalk between first output terminals 152a and 162a and second output terminals 152b and 162b may be prevented.

Therefore, attenuation of a signal may be excellent in a wide frequency band.

The compositions of the dielectric layer and the dummy dielectric layer may be the same as each other and are not particularly limited.

Referring to FIG. 4, in a composite electronic component, according to the exemplary embodiment in the present disclosure, dielectric layers 111 and dummy dielectric layers 111' may have different compositions from each other.

A plurality of dummy dielectric layers 111' having a different composition from the dielectric layers 111 may be inserted between the dielectric layers 111 on which first to fourth internal electrodes 121, 122, 121', and 122' are disposed as described above, such that crosstalk between first output terminals 152a and 162a and second output terminals 152b and 162b may be prevented.

The first to fourth internal electrodes 121, 122, 121', and 122' having leads externally exposed may be stacked in a second body.

The first to fourth internal electrodes 121, 122, 121', and 122' may be stacked perpendicularly to a mounting surface of the composite body 130.

In detail, the first to fourth internal electrodes 121, 122, 121', and 122' may be disposed perpendicularly to upper and lower surfaces of the multilayer ceramic capacitor array 120.

The leads of the first and second internal electrodes 121 and 122 may be exposed to the upper surface of the multilayer ceramic capacitor array 120, and the leads of the third and fourth internal electrodes 121' and 122' may be exposed to the lower surface of the multilayer ceramic capacitor array 120.

Fifth to eighth external electrodes 151a, 151b, 153a, and 153b may be connected to the first to fourth internal electrodes 121, 122, 121', and 122', respectively.

Figure 5:
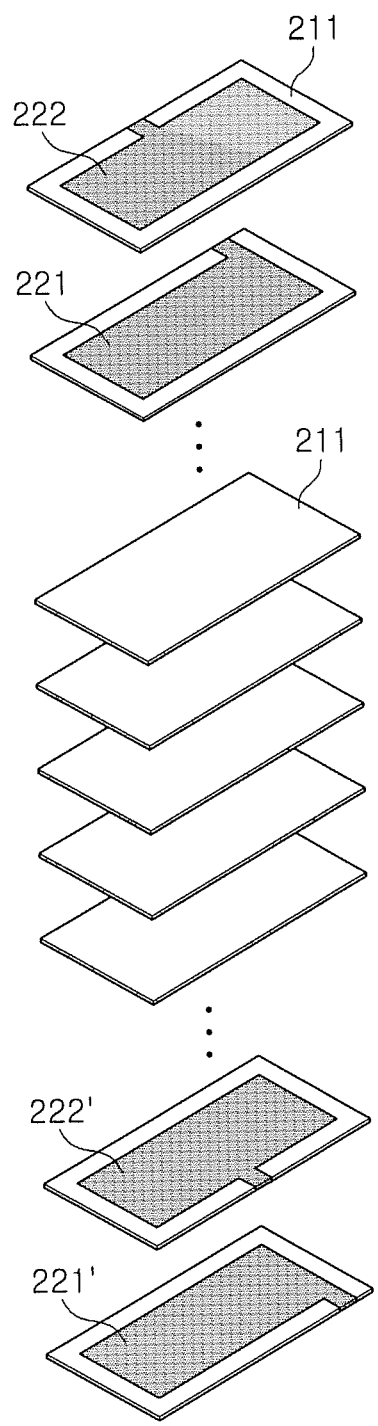
FIG. 5 is an exploded perspective diagram illustrating a form in which internal electrodes and dielectric layers of a multilayer ceramic capacitor array of FIG. 1 are stacked according to another exemplary embodiment in the present disclosure.

FIG. 5 is an exploded perspective diagram illustrating a form in which internal electrodes and dielectric layers of a multilayer ceramic capacitor array of FIG. 1 are stacked according to another exemplary embodiment in the present disclosure.

Referring to FIG. 5, in a composite electronic component, according to the exemplary embodiment in the present disclosure, a plurality of dielectric layers 211 and first to fourth internal electrodes 221, 222, 221' and 222' may be disposed in a multilayer ceramic capacitor array 120.

In the multilayer ceramic capacitor array 120, a plurality of dummy dielectric layers 211 may be inserted between the dielectric layers 211 on which the first to fourth internal electrodes 221, 222, 221', and 222' are disposed.

The plurality of dummy dielectric layers 211 may be inserted between the dielectric layers 211 on which the first to fourth internal electrodes 221, 222, 221', and 222' are disposed as described above, such that crosstalk between first output terminals 152a and 162a and second output terminals 152b and 162b may be prevented.

The first to fourth internal electrodes 221, 222, 221', and 222' may be stacked in parallel with a mounting surface of the composite body 130.

In detail, the first to fourth internal electrodes 221, 222, 221', and 222' may be disposed in parallel with upper and lower surfaces of the multilayer ceramic capacitor array 120.

Leads of the first and second internal electrodes 221 and 222 may be exposed to a first side surface of the multilayer ceramic capacitor array 120 in a width direction, and leads of the third and fourth internal electrodes 221' and 222' may be exposed to a second side surface of the multilayer ceramic capacitor array 120 in the width direction.

Fifth to eighth external electrodes 151a, 151b, 153a, and 153b may be connected to the first to fourth internal electrodes 221, 222, 221', and 222', respectively.

Figure 6:
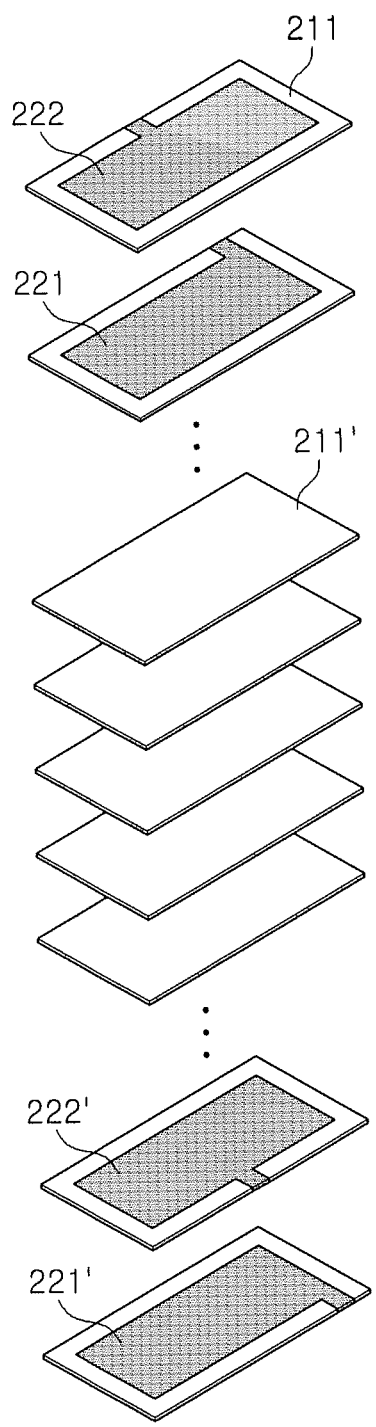
FIG. 6 is an exploded perspective diagram illustrating a form in which internal electrodes and dielectric layers of a multilayer ceramic capacitor array of FIG. 1 are stacked according to another exemplary embodiment in the present disclosure.

FIG. 6 is an exploded perspective diagram illustrating a form in which internal electrodes and dielectric layers of a multilayer ceramic capacitor array of FIG. 1 are stacked according to another exemplary embodiment in the present disclosure.

According to an exemplary embodiment illustrated in FIG. 6, a plurality of dummy dielectric layers 211' having a different composition from dielectric layers 211 may be inserted between the dielectric layers 211 on which the first to fourth internal electrodes, 221, 222, 221', and 222' are disposed, such that crosstalk between first output terminals 152a and 162a and second output terminals 152b and 162b may be prevented.

The first to fourth internal electrodes may be formed of a conductive paste containing a conductive metal.

The conductive metal may be nickel (Ni), copper (Cu), palladium (Pd), or an alloy thereof, but is not limited thereto.

Although pattern shapes of the first to fourth internal electrodes are illustrated in FIGS. 3 through 6, the pattern shapes and the number thereof are not limited thereto. In detail, the pattern shapes and the number thereof may vary.

Figure 7:
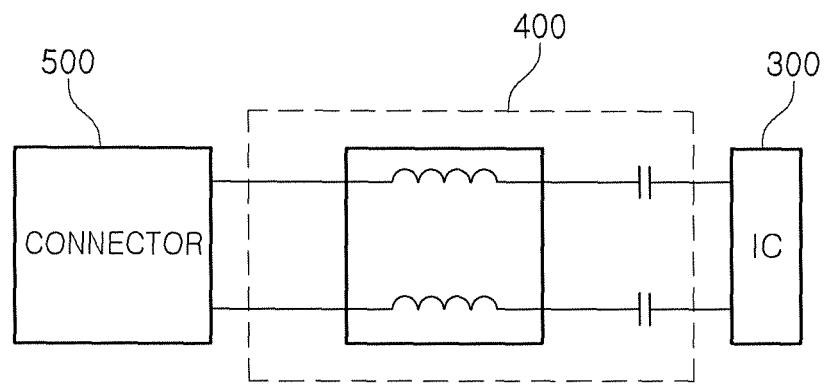
FIG. 7 is a circuit diagram to which the composite electronic component, according to the exemplary embodiment, is applied.

FIG. 7 is a circuit diagram to which the composite electronic component, according to an exemplary embodiment, is applied.

Referring to FIG. 7, an IC 300, a composite electronic component 400, and a connector 500 may be connected to each other.

A high-speed signal transmitted from the IC 300 may be applied to two input terminals of the composite electronic component 400 by a differential transmission scheme, and the composite electronic component may be composed of a common mode filter 110 and a multilayer ceramic capacitor array 120.

A noise component of the high-speed signal applied to the composite electronic component 400 by the differential transmission scheme may be filtered, and the filtered signal may then be output to the connector 500.

The common mode filter 110 and the multilayer ceramic capacitor array 120 may be mounted as the composite electronic component 130, which is a single component, on a board, such that a component disposition area may be decreased, and generation of noise may be suppressed.

Figure 8:
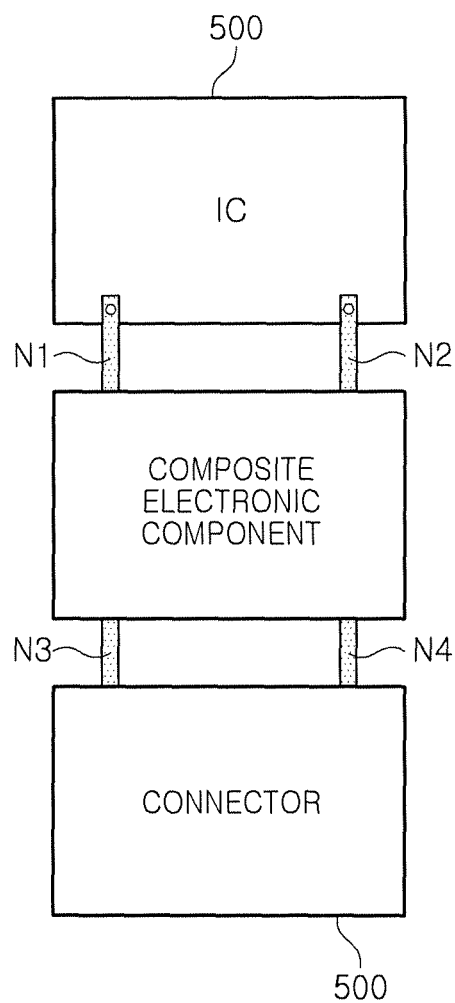
FIG. 8 is a diagram illustrating a disposition pattern of a system to which the composite electronic component, according to the exemplary embodiment, is applied.

FIG. 8 is a diagram illustrating a disposition pattern of a system to which the composite electronic component, according to the exemplary embodiment, is applied.

Referring to FIG. 8, it may be confirmed that the common mode filter and two multilayer ceramic capacitors illustrated in FIG. 7 are replaced by the composite electronic component in which the common mode filter 110 and the multilayer ceramic capacitor array 120 are coupled to each other according to an exemplary embodiment in the present disclosure.

As described above, the composite electronic component may perform a noise removal function of removing common mode noise in a differentially transmitted signal.

In addition, the number of disposed elements is decreased, such that the elements may be optimally disposed.

Further, the common mode filter 110 and the multilayer ceramic capacitor array 120 may be disposed to be as close to each other as possible, such that a wiring of a power line may be designed to be short and thick.

Therefore, noise generated when the wiring is disposed to be elongated may be decreased.

Meanwhile, in order to satisfy customers' demands, electronic device manufacturers have made efforts to decrease the size of printed circuit boards (PCBs) included in electronic devices.

Therefore, an increase in the degree of integration of an integrated circuit (IC) mounted on PCBs has been required.

This requirement may be satisfied by configuring a plurality of elements as a single composite component, as in the composite electronic component according to an exemplary embodiment in the present disclosure.

In addition, three components (the common mode filter and two multilayer ceramic capacitors) may be implemented as the single composite electronic component, such that the mounting area of a printed circuit board (PCB) may be decreased.

According to the present embodiment, the mounting area may be decreased by about 50% to 70% as compared to an existing disposition pattern.

Board Having Composite Electronic Component

Figure 9:
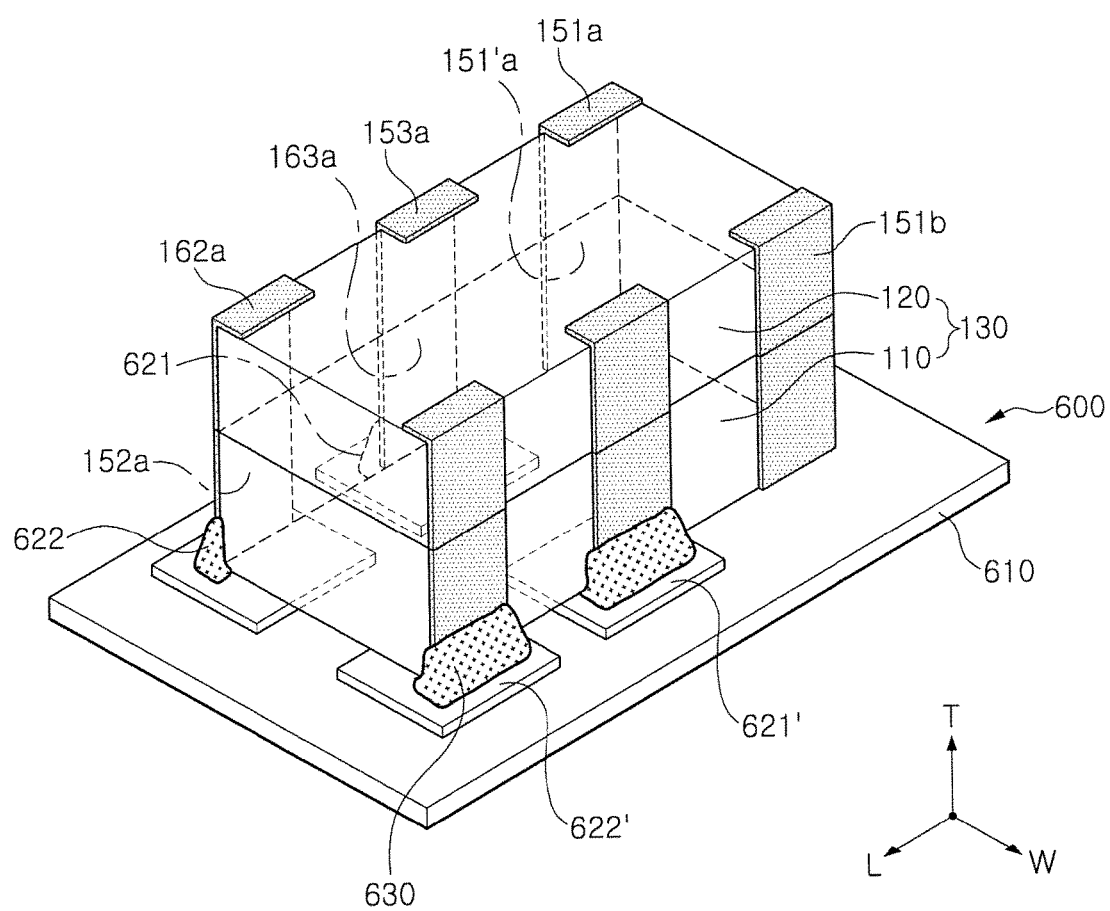
FIG. 9 is a perspective diagram illustrating a board in which the composite electronic component of FIG. 1 is mounted on a printed circuit board.

FIG. 9 is a perspective diagram illustrating a form in which the composite electronic component of FIG. 1 is mounted on a printed circuit board.

Referring to FIG. 9, a board 600 having a composite electronic component according to an present exemplary embodiment may include a printed circuit board 610 on which the composite electronic component is mounted and a plurality of electrode pads 621, 621', 622, and 622' disposed on an upper surface of the printed circuit board 610.

The electrode pads may be composed of first to fourth electrode pads 621, 621', 622, and 622' connected to the IC connection terminals 163a and 163b and the output terminals 152a and 152b of the composite electronic component, respectively.

In this case, the IC connection terminals 163a and 163b and the output terminals 152a and 152b of the composite electronic component may be electrically connected to the printed circuit board 610 by solders 630 in a state in which the IC connection terminals 163a and 163b and the output terminals 152a and 152b are positioned on the first to fourth electrode pads 621, 621', 622, and 622' so as to come in contact with each other, respectively.

A description of features of the board having a composite electronic component according to another exemplary embodiment overlapping with those of the composite electronic component according to the exemplary embodiment in the present disclosure as described above will be omitted in order to avoid an overlapping description.

Figure 10A:
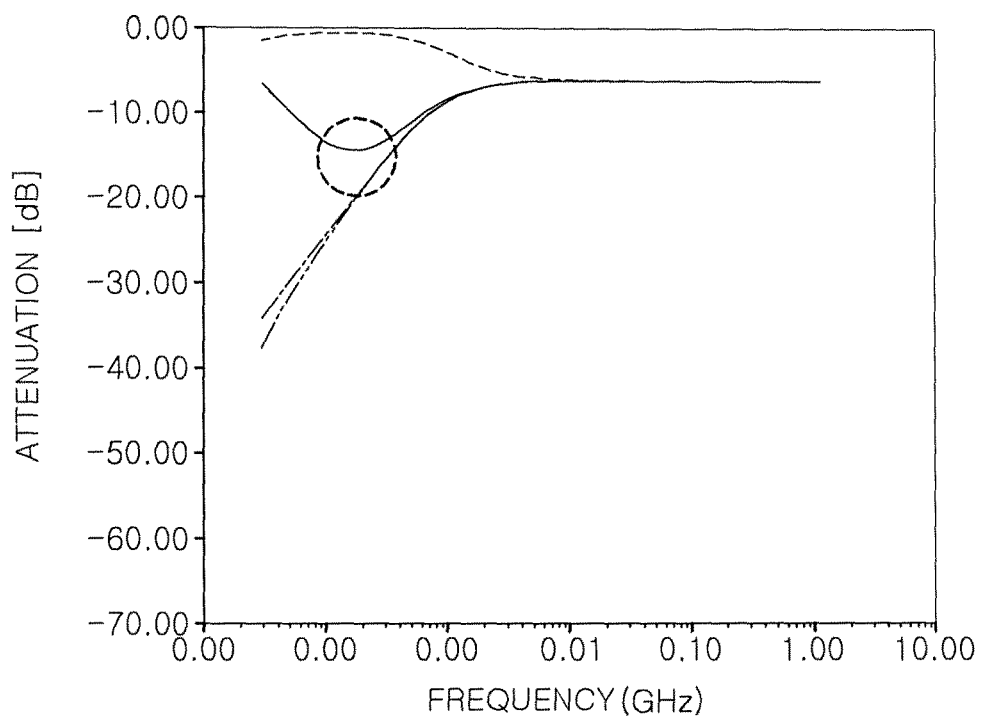
FIGS. 10A and 10B are graphs illustrating attenuation versus frequency for an Embodiment of the present disclosure and a Comparative Example.
Figure 10B:
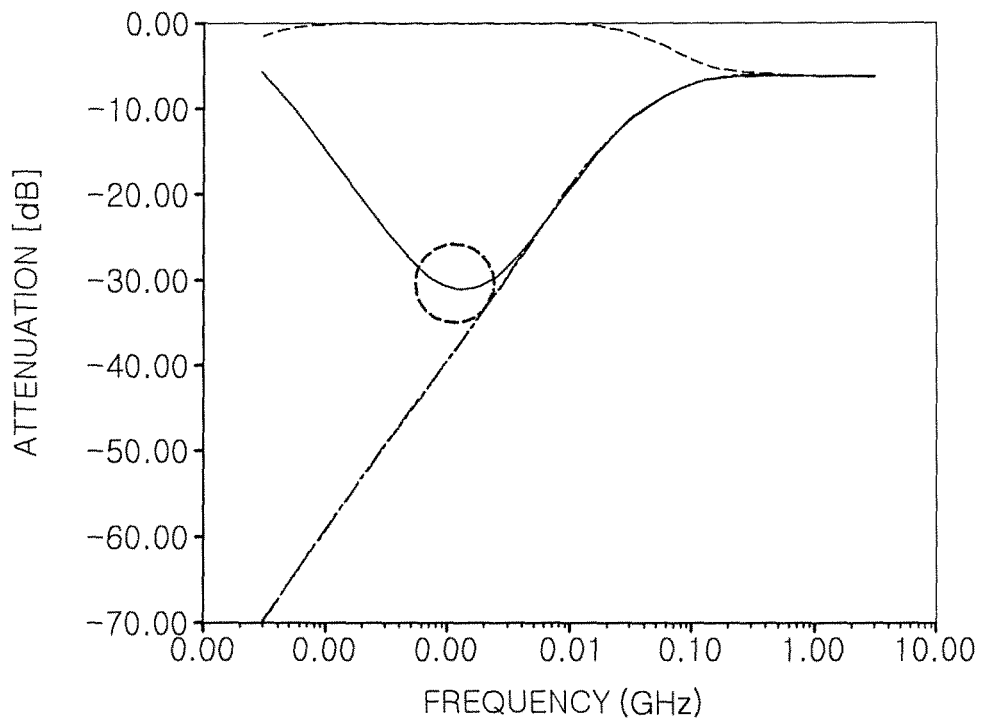

FIGS. 10A and 10B are graphs illustrating attenuation versus frequency of an Embodiment of the present disclosure and a Comparative Example in the present disclosure.

Referring to FIGS. 10A and 10B, it may be appreciated that in a case in which dummy dielectric layers are inserted into a multilayer ceramic capacitor array (Embodiment of the present disclosure), the pass characteristics, in detail, attenuation, is improved by about −15 dB or so as compared to a multilayer ceramic capacitor array having a general structure in which the dummy dielectric layers are not inserted (Comparative Example).

As set forth above, according to exemplary embodiments, the composite electronic component in which the component mounting area may be decreased in the LCD connector to which the differential transmission scheme of the high-speed signal is applied, and decreasing manufacturing costs, may be provided.

In addition, the composite electronic component for removing common mode noise in the LCD connector to which the differential transmission scheme of the high-speed signal is applied may be provided.

While exemplary embodiments have been shown and described above, it will be apparent to those skilled in the art that modifications and variations could be made without departing from the scope of the present inventive concept as defined by the appended claims.

What is claimed is:

1. A composite electronic component comprising:
   a composite body in which a common mode filter and a multilayer ceramic capacitor array are coupled to each other, the common mode filter including a common mode choke coil and having a plurality of side surfaces, and the multilayer ceramic capacitor array including a plurality of dielectric layers and having a plurality of side surfaces;
   first to fourth external electrodes disposed on two of the plurality of side surfaces of the common mode filter opposite each other and electrically connected to the common mode choke coil, and first and second connecting electrodes disposed on the two side surfaces of the common mode filter and insulated from the first to fourth external electrodes; and
   fifth to eighth external electrodes disposed on two of the plurality of side surfaces of the multilayer ceramic capacitor array, and third and fourth connecting electrodes disposed on the two side surfaces of the multilayer ceramic capacitor array and insulated from the fifth to eighth external electrodes,
   wherein the composite body includes
      first IC connection terminals and second IC connection terminals formed by coupling the first connecting electrode and the seventh external electrode and coupling the second connecting electrode and the eighth external electrode, respectively,
      first input terminals and second input terminals formed by coupling the fifth and first external electrodes and coupling the sixth and second external electrodes, respectively, and
      first output terminals and second output terminals formed by coupling the third external electrode and the third connecting electrode and coupling the fourth external electrode and the fourth connecting electrode, respectively, and
   wherein, in the multilayer ceramic capacitor array, a plurality of dummy dielectric layers are disposed between the plurality of dielectric layers on which internal electrodes of the capacitor array are disposed,
   wherein none of the plurality of dummy dielectric layers has an internal electrode disposed thereon.

2. The composite electronic component of claim 1, wherein the common mode filter and the multilayer ceramic capacitor array are coupled to each other by a conductive adhesive.

3. The composite electronic component of claim 1, wherein the plurality of dielectric layers and the plurality of dummy dielectric layers have different compositions.

4. The composite electronic component of claim 1, wherein the internal electrodes of the multilayer ceramic capacitor array includes first to fourth internal electrodes stacked therein and having leads exposed externally.

5. The composite electronic component of claim 4, wherein the fifth to eighth external electrodes are connected to the first to fourth internal electrodes, respectively.

6. The composite electronic component of claim 4, wherein the first to fourth internal electrodes are perpendicular to a mounting surface of the composite body.

7. The composite electronic component of claim 4, wherein the first to fourth internal electrodes are disposed in parallel with a mounting surface of the composite body.

8. The composite electronic component of claim 1, wherein a lower surface of the multilayer ceramic capacitor array is coupled to an upper surface of the common mode filter.

9. A composite electronic component comprising:
   a composite body in which a common mode filter and a multilayer ceramic capacitor array are coupled to each other, the common mode filter including a common mode choke coil, and the multilayer ceramic capacitor array including a plurality of dielectric layers; and
   wherein the multilayer ceramic capacitor array includes a plurality of internal electrodes disposed on the plurality of dielectric layers and a plurality of dummy dielectric layers, wherein the plurality of dummy dielectric layers are disposed between the plurality of dielectric layers having the internal electrodes of the capacitor, and
   wherein none of the plurality of dummy dielectric layers has an internal electrode disposed thereon.

10. The composite electronic component of claim 9, wherein the plurality of dummy dielectric layers have a different composition than the plurality of dielectric layers.

* * * * *